United States Patent

Honma et al.

[11] Patent Number: 5,850,288
[45] Date of Patent: Dec. 15, 1998

[54] METHOD FOR MANUFACTURING A SEMICONDUCTOR DEVICE

[75] Inventors: Ichirou Honma; Fumiki Aisou, both of Tokyo, Japan

[73] Assignee: NEC Corporation, Japan

[21] Appl. No.: 804,398

[22] Filed: Feb. 21, 1997

Related U.S. Application Data

[63] Continuation of Ser. No. 615,875, Mar. 14, 1996.

[30] Foreign Application Priority Data

Mar. 16, 1995 [JP] Japan ..................................... 7-83482

[51] Int. Cl.$^6$ .................................................. G01B 11/30
[52] U.S. Cl. .......................... 356/371; 356/376; 356/237; 356/445
[58] Field of Search ..................................... 356/371, 376, 356/237, 445, 448

[56] References Cited

U.S. PATENT DOCUMENTS 5,488,476   1/1996   Mansfield et al. .................. 356/371 X
5,563,709  10/1996   Poultney .................................. 356/371

*Primary Examiner*—Frank G. Font
*Assistant Examiner*—Reginald A. Ratliff
*Attorney, Agent, or Firm*—Hayes, Soloway, Hennessey, Grossman & Hage, P.C.

[57] ABSTRACT

In a system for detecting a degree of unevenness of a surface of a semiconductor device, the surface is irradiated with light having a wavelength of approximately 240 nm to 500 nm. The degree of unevenness of the surface is determined in accordance with an intensity of reflected light from the surface.

6 Claims, 16 Drawing Sheets

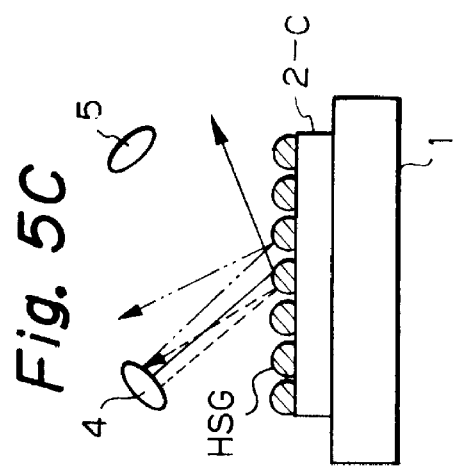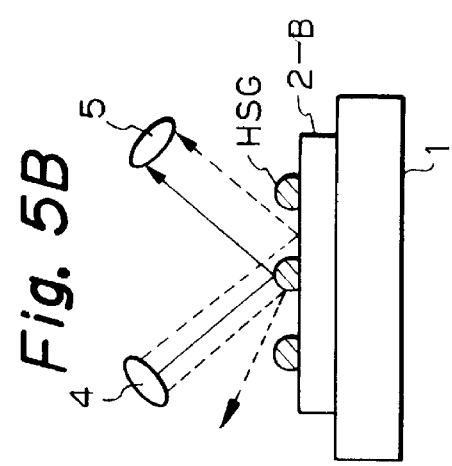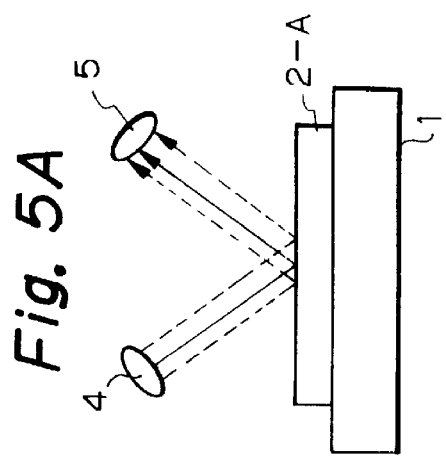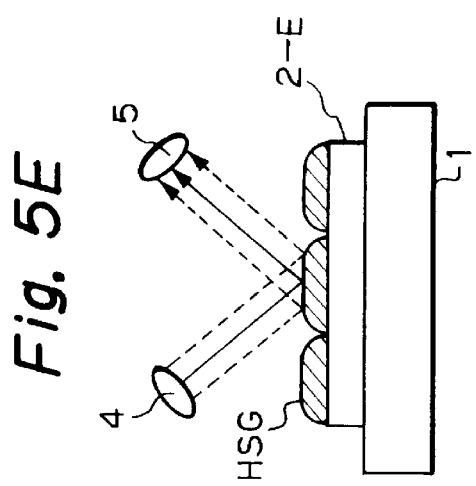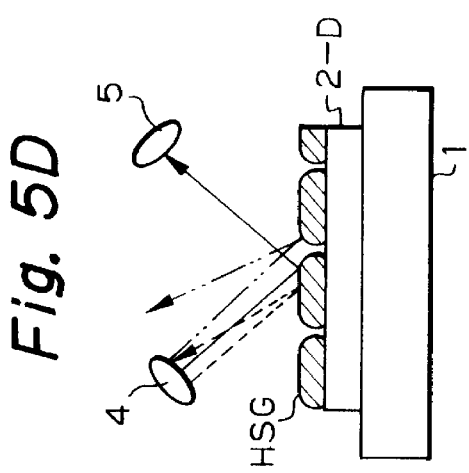

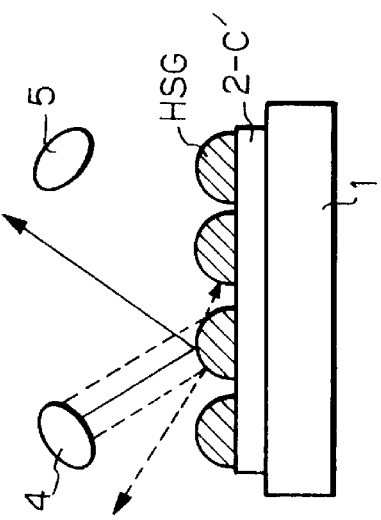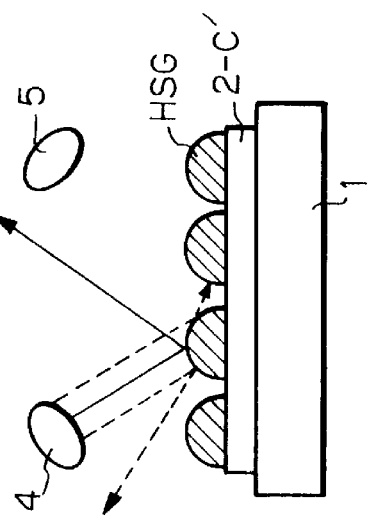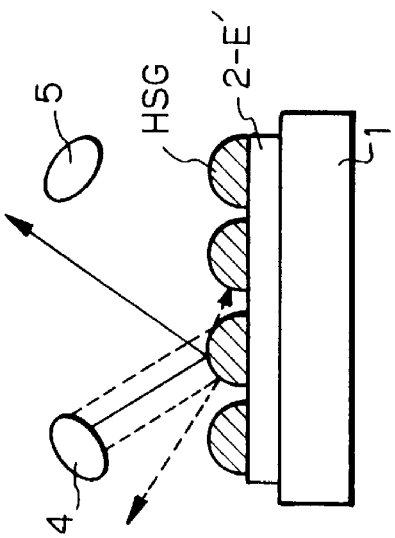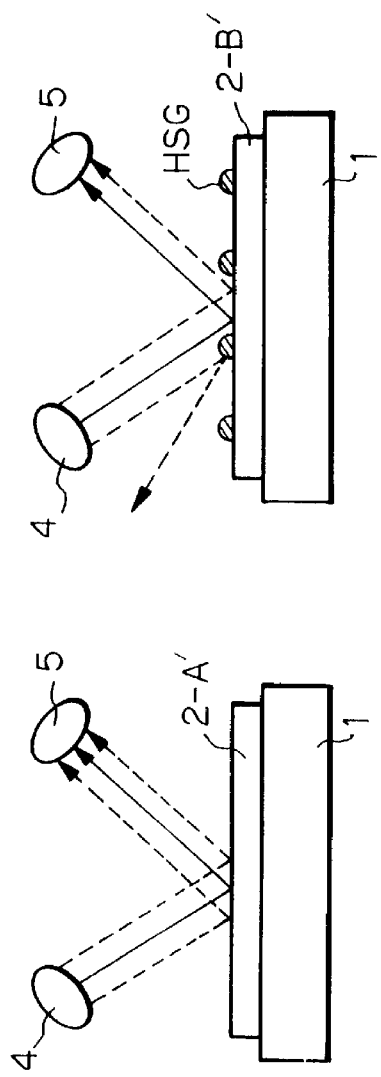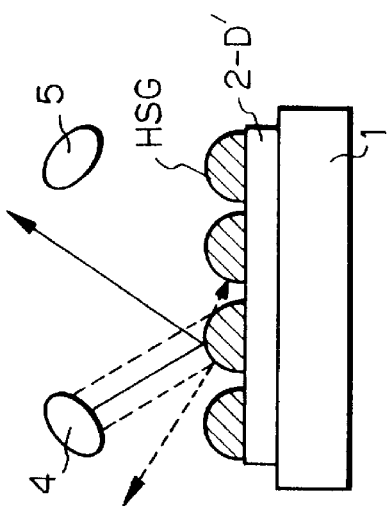

METHOD FOR MANUFACTURING A SEMICONDUCTOR DEVICE

This is a continuation of copending application Ser. No. 08/615,875 filed on Mar. 14, 1996, and still pending.

BACKGROUND OF THE INVENTION

1. Field of the Invention

The present invention relates to a system for detecting a degree of unevenness of a surface of a semiconductor device such as a dynamic random access memory (DRAM) device.

2. Description of the Related Art

As DRAM devices have been more developed, a cell area has also been more decreased, and accordingly, the capacity of a cell capacitor has been more decreased. As a result, the DRAM devices are subject to soft errors caused by α-rays.

In order to increase the capacity of a cell capacitor, a staked capacitor having a hemispherical-grain (HSG) polycrystalline silicon electrode is known (see: H. Watanabe et al., "A New Stacked Capacitor Structure Using Hemispherical-Grain (HSG) Poly-Silicon Electrodes", Ext. Abs. 22nd Conference on Solid State Device and Materials. pp. 873–876, 1990). That is, use is made of a thermal migration phenomenon of silicon atoms to thereby make an electrode surface uneven, thus increasing the capacity of the cell capacitor. In this case, the degree of unevenness of the electrode surface depends upon the natural oxide thereof, and accordingly, the capacity of the cell capacitor may fluctuate. Therefore, it is necessary to estimate or detect a degree of unevenness of the electrode surface.

In a first prior art method for detecting a degree of unevenness of an electrode surface, the degree of unevenness is observed directly by an electron microscopy. In the first prior art method, however, an observed area is very small, so that it is actually impossible to observe the entire semiconductor device (or wafer). Also, an electron microscopy capable of observing the wafer without splitting it is generally used for measuring a length and has a resolution of about 300 nm, and it is impossible to observe a semispherical grain having a radius of about 5 nm.

In a second prior art method for detecting a degree of unevenness of an electrode surface, a capacitor is actually formed by an electrode, and the degree of unevenness of the electrode surface is estimated by measuring the capacity of the capacitor. Although the obtained degree of unevenness is accurate, it is time-consuming to form the capacitor for the estimation of the degree of unevenness of the electrode surface.

In a third prior art method for detecting a degree of unevenness of an electrode surface, the degree of unevenness of the electrode surface is estimated by qualitatively measuring the electrode surface using an absorption method such as a gas absorption BET scanning method. In the third prior art method, however, since gas is absorbed into the DRAM devices, the characteristics of the DRAM devices are changed.

In a fourth prior art method for detecting a degree of unevenness of an electrode surface, X-rays are irradiated so as to be incident at an angle less than a critical angle of total reflection on the electrode surface, and an intensity of secondary X-rays from the electrode surface is measured, thus determining the unevenness of the electrode surface. In the fourth prior art method, however, it is impossible to reduce a measured spot. Also, the X-rays excite electrons in the DRAM devices, and particularly, the X-rays create electron-hole pairs in channel regions under the electrode surface. Thus, the characteristics of the DRAM devics are deteriorated.

In a fifth prior art method for detecting a degree of unevenness of an electrode surface, white light is incident on the electrode surface, and an intensity of reflected light from the electrode surface is measured, thus determining the unevenness of the electrode surface. In the fifth prior art method, however, since the reflected light is dependent upon the properties of amorphous silicon of the electrode, the reliability of the detected degree of unevenness is low.

SUMMARY OF THE INVENTION

It is an object of the present invention to provide an easy and reliable system for detecting a degree of unevenness of a surface of a semiconductor device, which would not affect the characteristics of the device.

According to the present invention, in a system for detecting a degree of unevenness of a surface of a semiconductor device, the surface is irradiated with light having a wavelength of approximately 240 nm to 500 nm. The degree of unevenness of the surface is determined in accordance with an intensity of reflected light from the surface.

BRIEF DESCRIPTION OF THE DRAWINGS

The present invention will be more clearly understood from the description as set forth below, as compared with the prior art, with reference to the accompanying drawings, wherein:

FIGS. 5A, 5B, 5C, 5D and 5E are diagrams showing the states of HSG polycrystalline silicon grown on the wafer of FIG. 4;

FIGS. 7A, 7B, 7C, 7D and 7E are diagrams showing the states of HSG polycrystalline silicon grown on the wafer of FIG. 4;

DESCRIPTION OF THE PREFERRED EMBODIMENTS

Before the description of the preferred embodiments, a prior art method for manufacturing a semiconductor device will be explained with reference to FIGS. 1A through 1F.

Figure 1A:
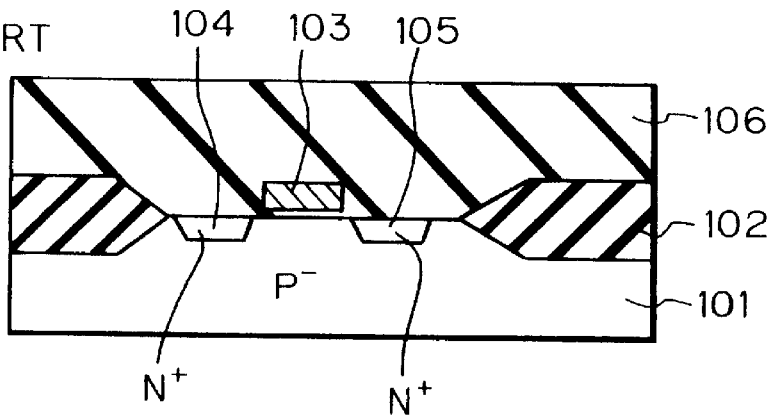
FIGS. 1A through 1F are cross-sectional views showing a method for manufacturing a semiconductor device having an HSG polycrystalline silicon electrode.

First, referring to FIG. 1A, a $P^-$-type monocrystalline silicon substrate 101 is thermally oxidized to form a field silicon oxide layer 102. Then, a gate electrode 103 is formed via a gate silicon oxide layer on the substrate 101. Then, $N^+$-type impurity diffusion regions 104 and 105 are formed within the substrate 101 using the gate electrode 103 as a mask. Then, an insulating layer 106 is formed on the entire surface.

Figure 1B:
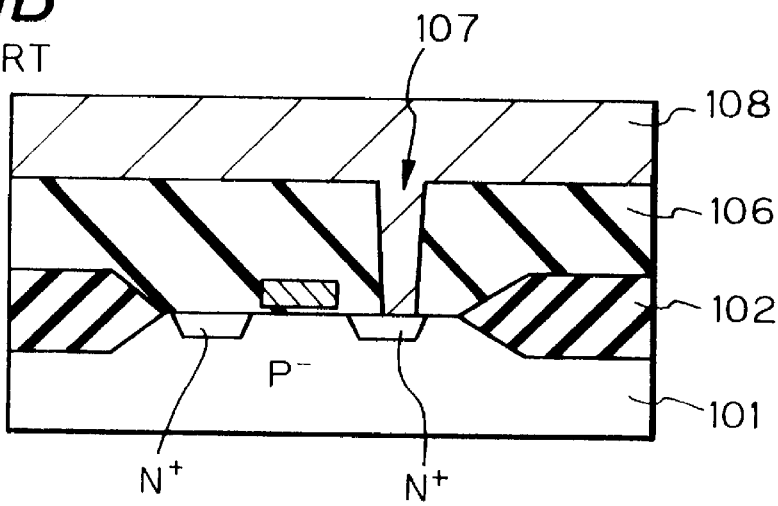

Next, referring to FIG. 1B, a contact hole 107 is perforated in the insulating layer 106 by a photolithography and etching process. Then, a phosphorus-doped amorphous silicon layer 108 is deposited by a low pressure chemical vapor deposition (LPCVD) process.

Figure 1C:
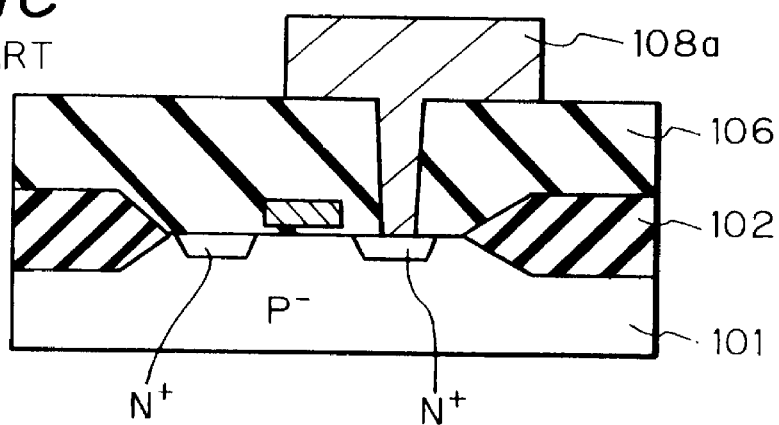

Next, referring to FIG. 1C, the amorphous silicon layer 108 is patterned by a photolithography and etching process, to form an amorphous silicon pattern 108a.

Figure 1D:
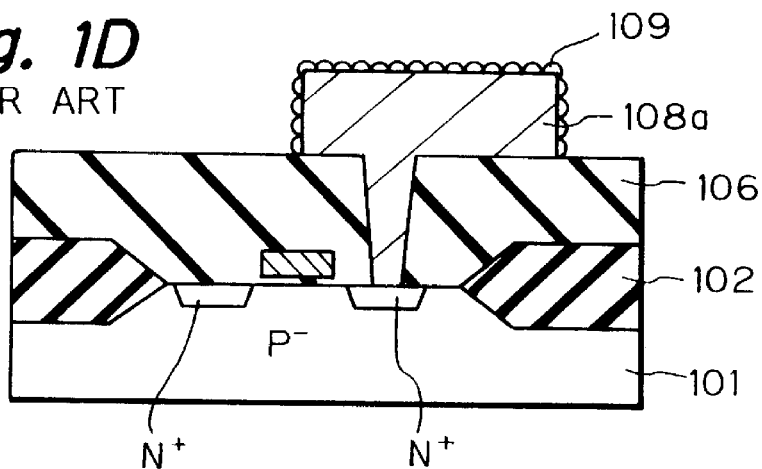

Next, referring to FIG. 1D, an HSG polycrystalline silicon layer 109 is grown on the amorphous silicon pattern 108a. That is, the device is put in a chamber at a temperature of about 580° C. and at a pressure of 1 mTorr. Then, a gas of $Si_2H_6$ is supplied to the chamber for about 10 minutes, and thereafter, a gas of $N_2$ is supplied to the chamber for about 30 minutes. Thus, the HSG polycrystalline silicon layer 109 having an uneven surface is formed on the amorphous silicon pattern 108a, to substantially increase the surface of the capacitor electrode 108a.

Figure 1E:
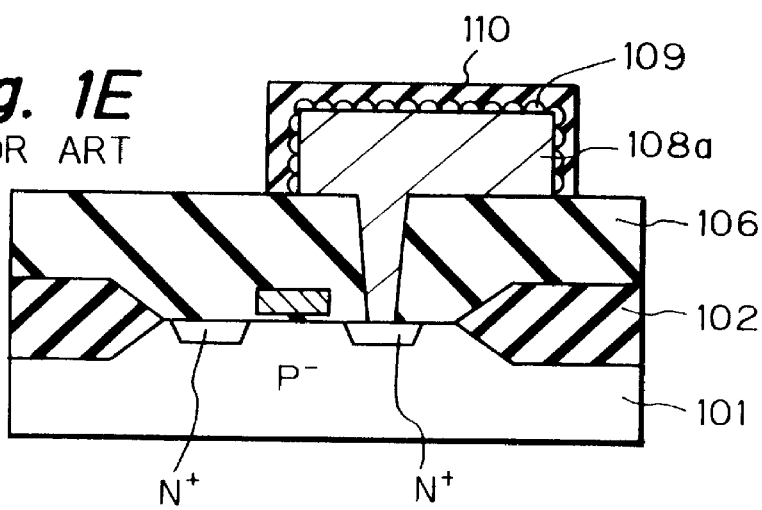

Next, referring to FIG. 1E, a capacitor insulating layer 110 made of silicon oxide is formed on the HSG polycrystalline silicon layer 109.

Figure 1F:
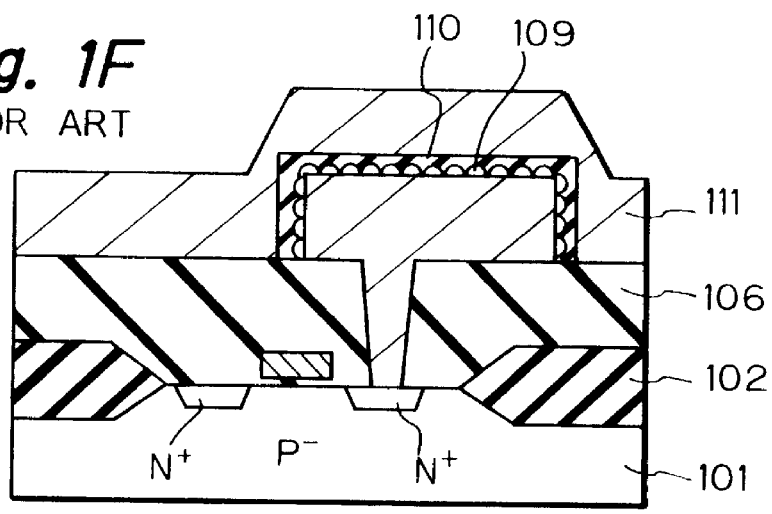

Finally, referring to FIG. 1F, a counter plate electrode 111 made of polycrystalline silicon is formed on the capacitor insulating layer 110.

Thus, a cell capacitor is formed by a lower electrode (108a, 109,) an upper electrode (111) and an insulating layer (110) therebetween.

Figure 2A:
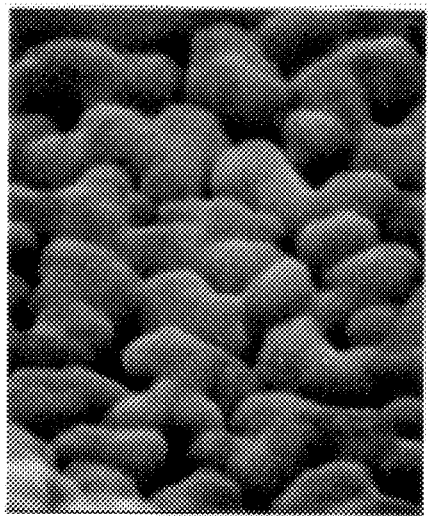
FIGS. 2A and 2B are photographs showing examples of HSG polycrystalline silicon.
Figure 2B:
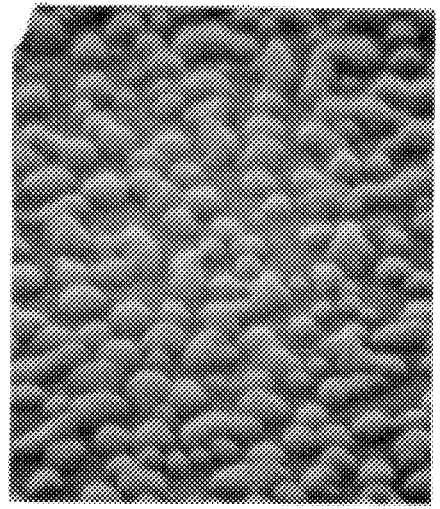

As explained above, the HSG polycrystalline silicon layer 109 is grown by using a thermal migration phenomenon of silicon atoms. Therefore, if a natural oxide layer on the amorphous silicon pattern 108a is completely removed before the forming of the HSG polycrystalline silicon layer 109, large hemispherical grains as shown in FIG. 2A are formed. Contrary to this, if a natural oxide layer on the amorphous silicon pattern 108a is incompletely removed before the forming of the HSG polycrystalline silicon layer 109, small hemispherical grains as shown in FIG. 2B are formed.

Figure 3:
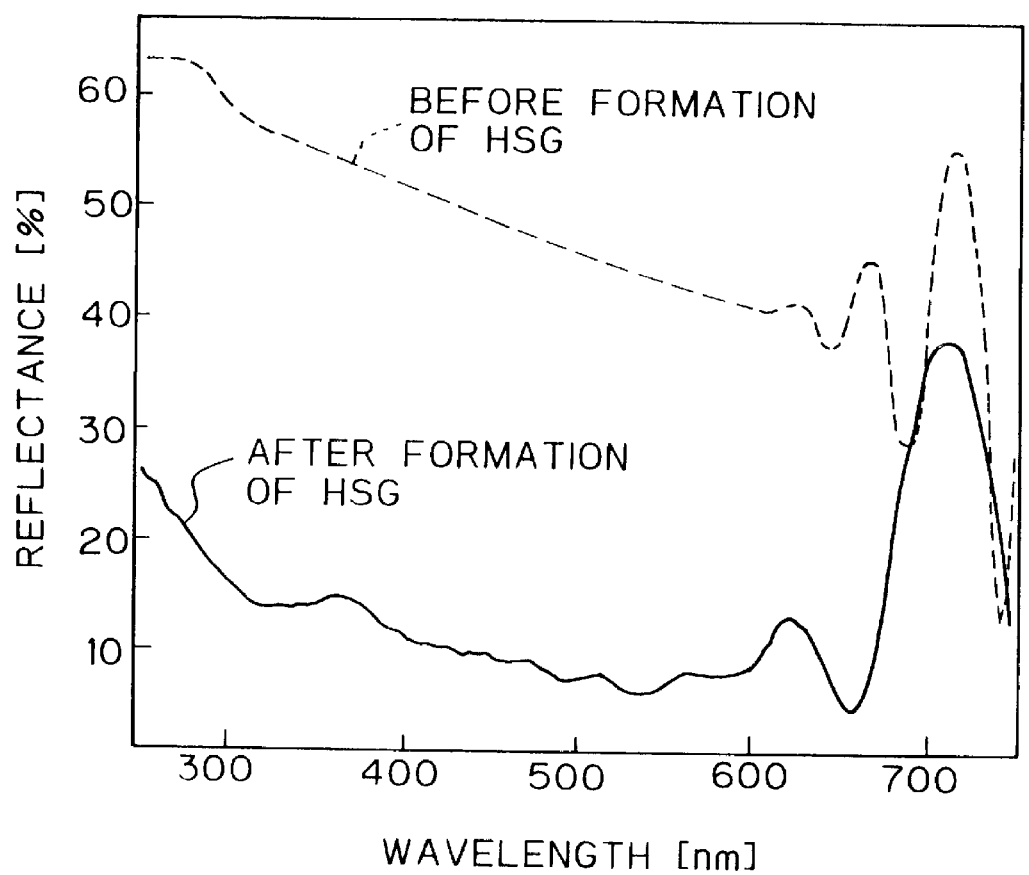
FIG. 3 is a graph showing light reflectance characteristics of amorphous silicon and HSG polycrystalline silicon.

In FIG. 3, which shows reflectance characteristics of amorphous silicon and HSG polycrystalline silicon, a dotted line indicates a light reflectance of amorphous silicon, and a solid line indicates a light reflectance of HSG polycrystalline silicon deposited on the amorphous silicon. In a wavelength range of light from 240 nm to 550 nm, as the wavelength is increased, the light reflectance of the amorphous silicon and the light reflectance of the HSG polycrystalline silicon are both monotonously decreased. This is because the light absorption coefficient of the amorphous silicon is very large, and accordingly, incident light is mostly absorbed in the amorphous silicon. The thicker the amorphous silicon, the larger the fluctuation of reflectance. Also, the larger the crystal ratio of the amorphous silicon, the larger the fluctuation of reflectance. That is, the smaller the refractive index of the amorphous silicon, the larger the fluctuation of reflectance.

However, in a wavelength range of light from 550 nm to 750 nm, the light reflectance of the amorphous silicon and the light reflectance of the HSG polycrystalline silicon both greatly fluctuate. This is because reflected light from the upper surface of the amorphous silicon interferes with reflected light from an interface between the amorphous silicon and its underlying layer such as the insulating layer 106.

Thus, use is made of light having a wavelength from approximately 240 nm to 500 nm, thus detecting a degree of unevenness of a surface of the HSG polycrystalline silicon, without being subject to the properties and thickness of the amorphous silicon and its underlying layer.

Figure 4:
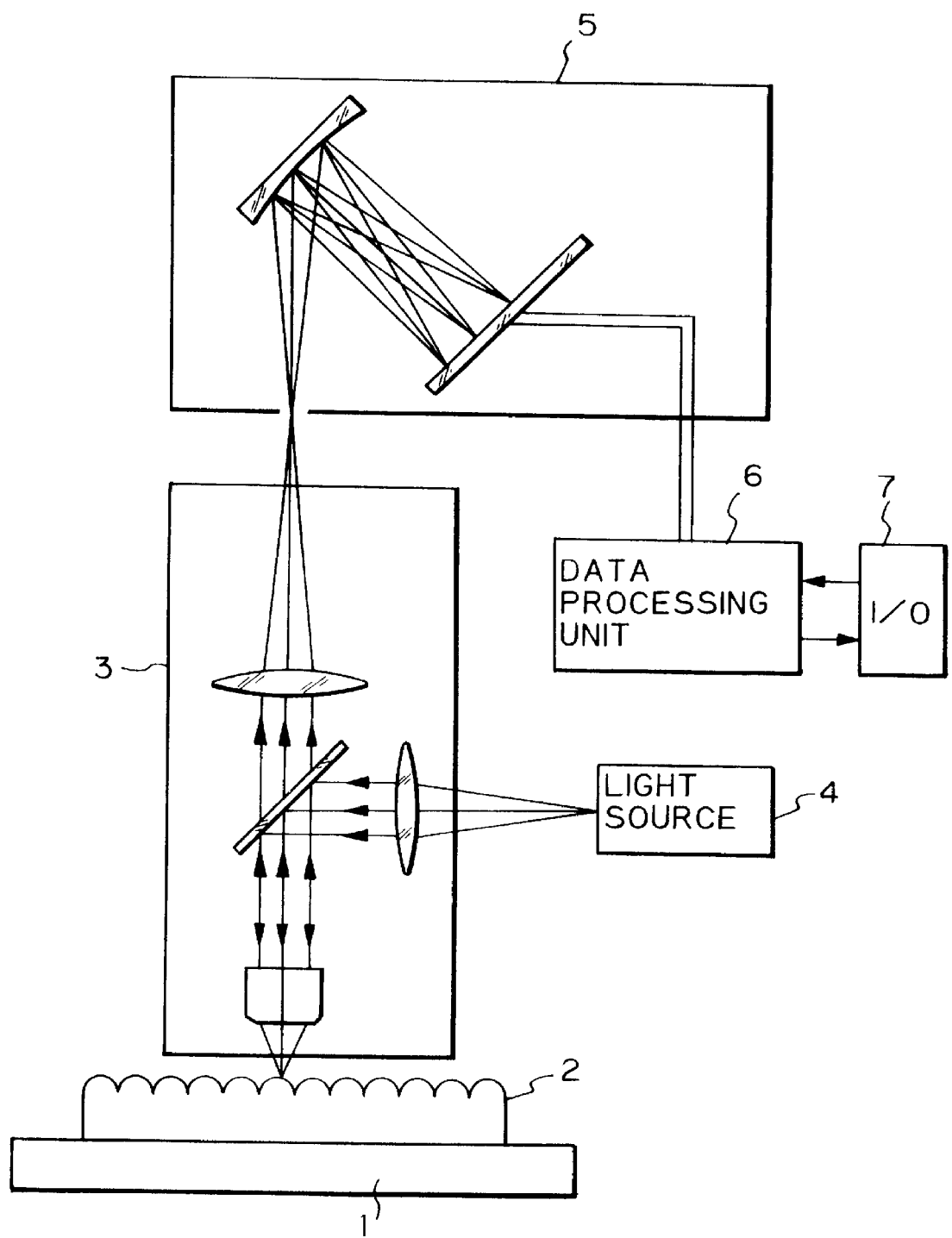
FIG. 4 is a diagram illustrating a first embodiment of the unevenness detecting system according to the present invention.

In FIG. 4, which illustrates a first embodiment of the unevenness detecting system according to the present invention, reference numeral 1 designates a stage for mounting a semiconductor device which is, in this case, a wafer 2. Also, an optical system 3 receives light having a wavelength of about 240 nm to 500 nm from a light source 4 and irradiates the wafer 2 with this light. Also, the optical system 3 receives reflected light from the wafer 2 and transmits it to a spectroscope 5 which is connected to a data processing unit 6. The data processing unit 6 is comprised of a computer connected to an input/output unit 7.

Figure 6:
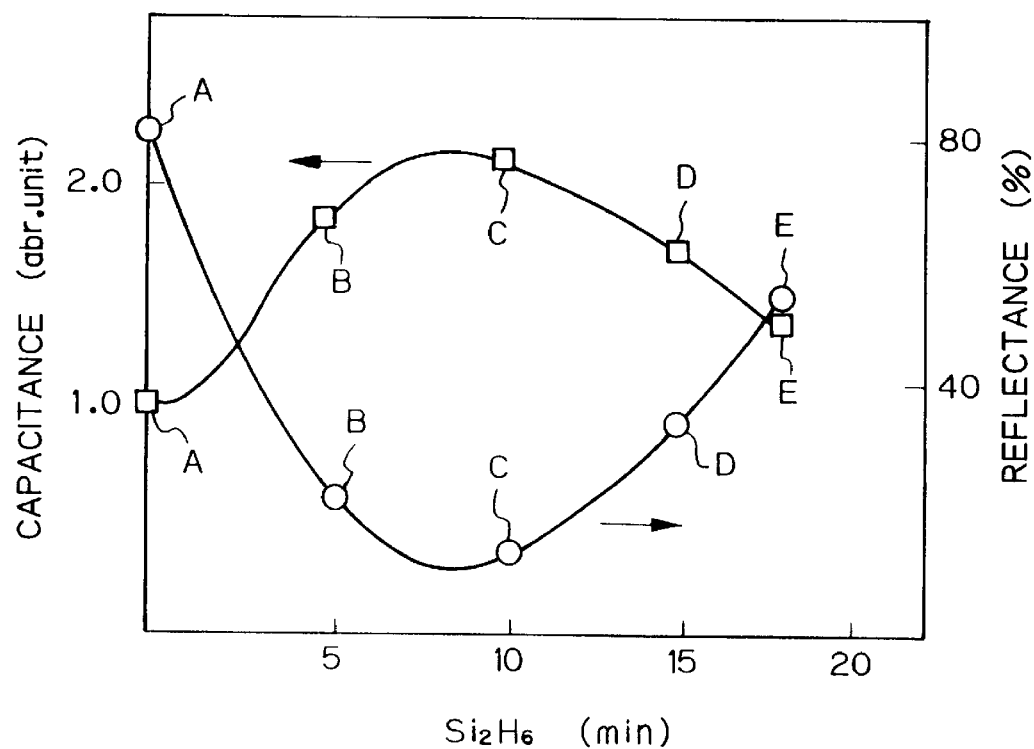
FIG. 6 is a diagram of the reflectance characteristics and the capacitance characteristics of the HSG polycrystalline silicon of FIGS. 5A, 5B, 5C, 5D and 5E.

FIGS. 5A, 5B, 5C, 5D and 5E are diagrams showing the states of HSG polycrystalline silicon grown on the wafers 2 (2-A, 2-B, 2-C, 2-D and 2-E) of FIG. 4. In FIGS. 5A to 5E, note that the light source 4 and the spectroscope 5 are located opposite to each other for easily understanding the light reflectance. The wafers 2-A, 2-B, 2-C, 2-D and 2-E have the same amorphous silicon layer (not shown) thereon. The wafers 2-A, 2-B, 2-C, 2-D and 2-E are put in a chamber at a temperature of about 580° C. and at a pressure of about 1 mTorr. Then, a gas of $Si_2H_6$ is supplied for 0, 5, 10, 15 and 18 minutes for the wafers 2-A, 2-B, 2-C, 2-D and 2-E, respectively, and thereafter, a gas of $N_2$ is supplied for 10 minutes. As a result, as illustrated in FIG. 5A, 5B and 5C, as the supplying time of $Si_2H_6$ is increased, the density of HSG polycrystalline silicon is increased, so that the surface area of the HSG polycrystalline silicon is increased. In this case, as shown in FIG. 6, the light reflectance is decreased and the capacitance of a capacitor using the HSG polycrystalline silicon is increased. On the other hand, as illustrated in FIGS. 5D and 5E, as the supplying time of $Si_2H_6$ is further increased, the size of HSG polycrystalline silicon is increased, so that the surface area of the HSG polycrystalline silicon is decreased. In this case, as shown in FIG. 6, the reflectance is increased and the capacitance of a capacitor using the HSG polycrystalline silicon is decreased.

Figure 8:
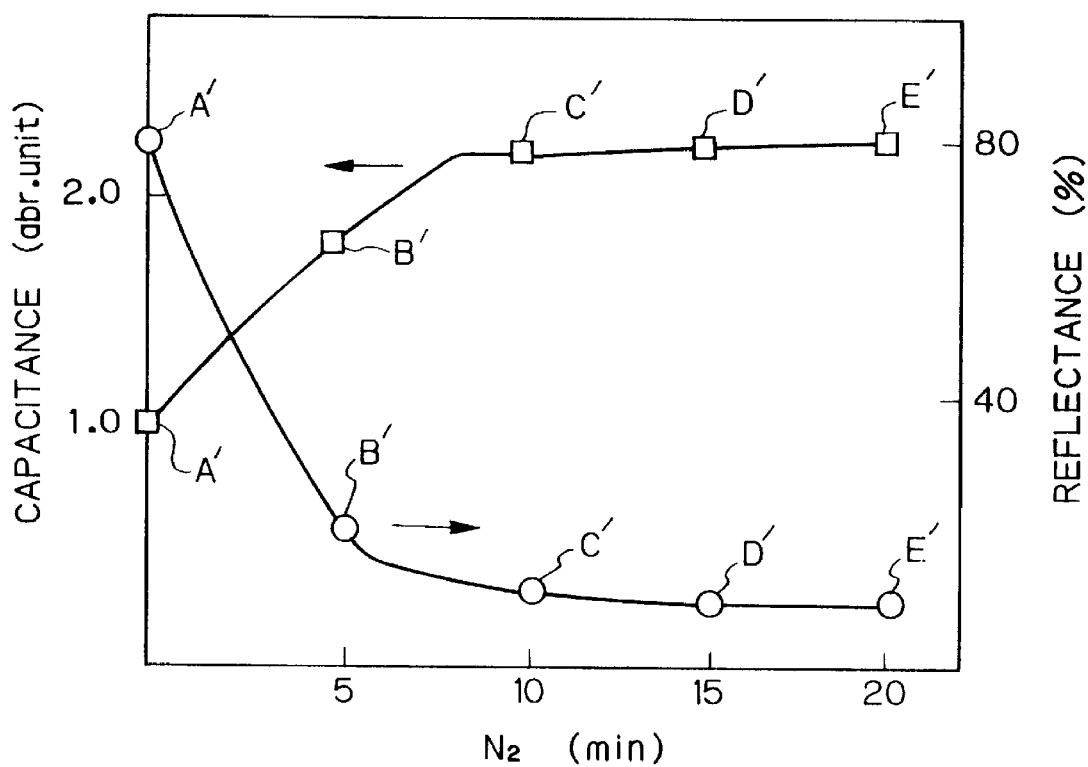
FIG. 8 is a diagram of the reflectance characteristics and the capacitance characteristics of the HSG polycrystalline silicon of FIGS. 7A, 7B, 7C, 7D and 7E.

FIGS. 7A, 7B, 7C, 7D and 7E are diagrams showing the states of HSG polycrystalline silicon grown on the wafers 2 (2-A', 2-B', 2-C', 2-D' and 2-E') of FIG. 4. The wafers 2-A', 2-B', 2-C', 2-D' and 2-E' have the same amorphous silicon layer (not shown) thereon. The wafers 2-A', 2-B', 2-C', 2-D' and 2-E' are put in a chamber at a temperature of about 580° C. and at a pressure of about 1 mTorr. Then, a gas of $Si_2H_6$ is supplied for 3 minutes, and thereafter, a gas of $N_2$ is supplied for 0, 5, 10, 15 and 20 minutes for the wafers 2-A, 2-B, 2-C, 2-D and 2-E, respectively. As a result, as illustrated in FIG. 8A, 8B and 8C, as the supplying time of $N_2$ is increased, the density of HSG polycrystalline silicon is increased, so that the surface area of the HSG polycrystalline silicon is increased. In this case, as shown in FIG. 8, the light reflectance is decreased and the capacitance of a capacitor using the HSG polycrystalline silicon is increased. On the other hand, as illustrated in FIGS. 7D and 7E, as the supplying time of $N_2$ is further increased, the size of HSG polycrystalline silicon is not increased, so that the surface area of the HSG polycrystalline silicon is not decreased. In this case, as shown in FIG. 8, the light reflectance is unchanged and the capacitance of a capacitor using the HSG polycrystalline silicon is unchanged.

Figure 9:
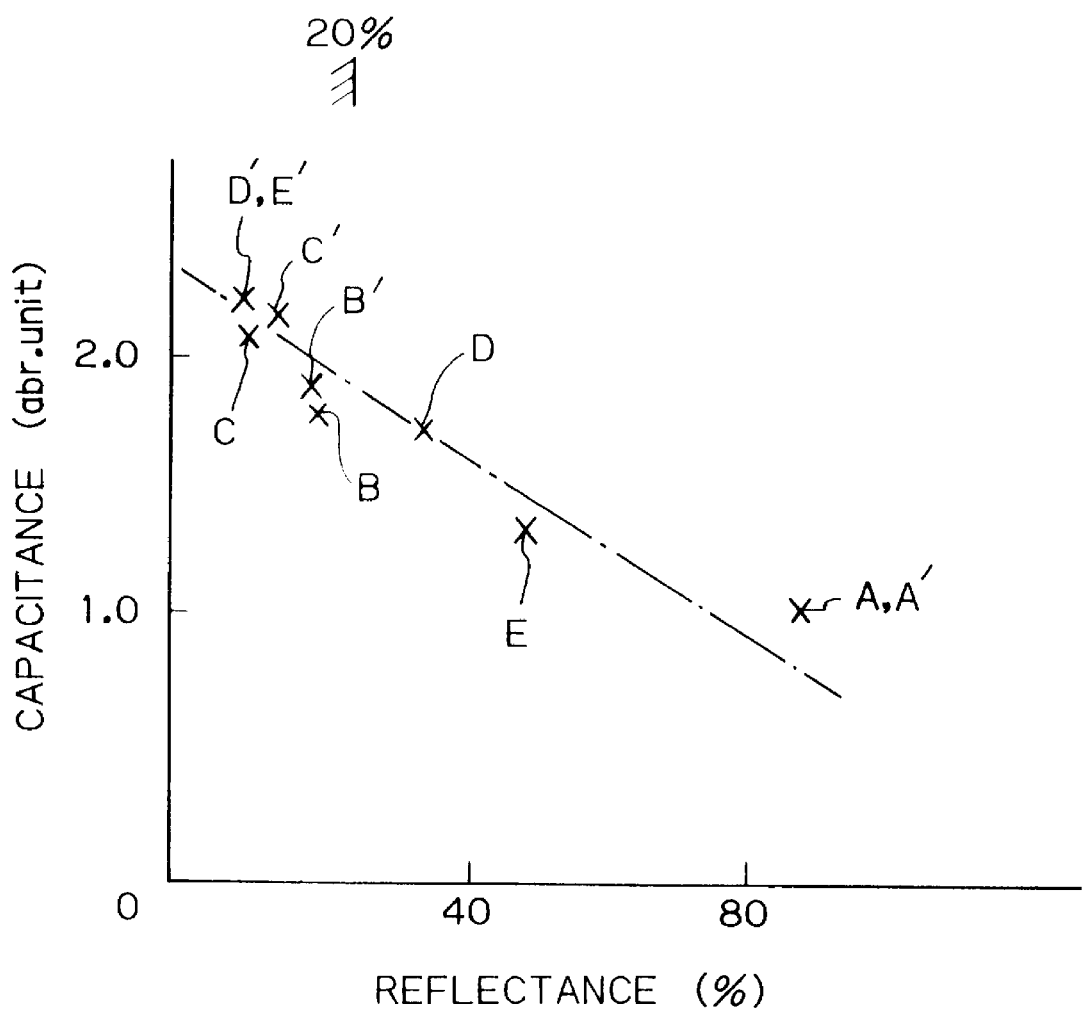
FIG. 9 is a graph showing a linear relationship between the reflectance and capacitance of HSG polycrystalline silicon according to the present invention.

Thus, the light reflectance has a relationship to the unevenness degree of the surface of the HSG polycrystalline silicon, and the capacitance has a relationship to the unevenness degree of the surface of the HSG polycrystalline silicon. In more detail, as shown in FIG. 9, the light reflectance has a linear relationship to the capacitance, i.e., the unevenness of the surface of the HSG polycrystalline silicon. In the case as shown in FIG. 9, the data processing unit 6 stores a reference value 20% of the light reflectance, and determines whether or not an obtained light reflectance is less than 20%. If the obtained light reflectance is not less than 20%, the wafer is again processed for depositing HSG polycrystalline silicon on the wafer.

Figure 10:
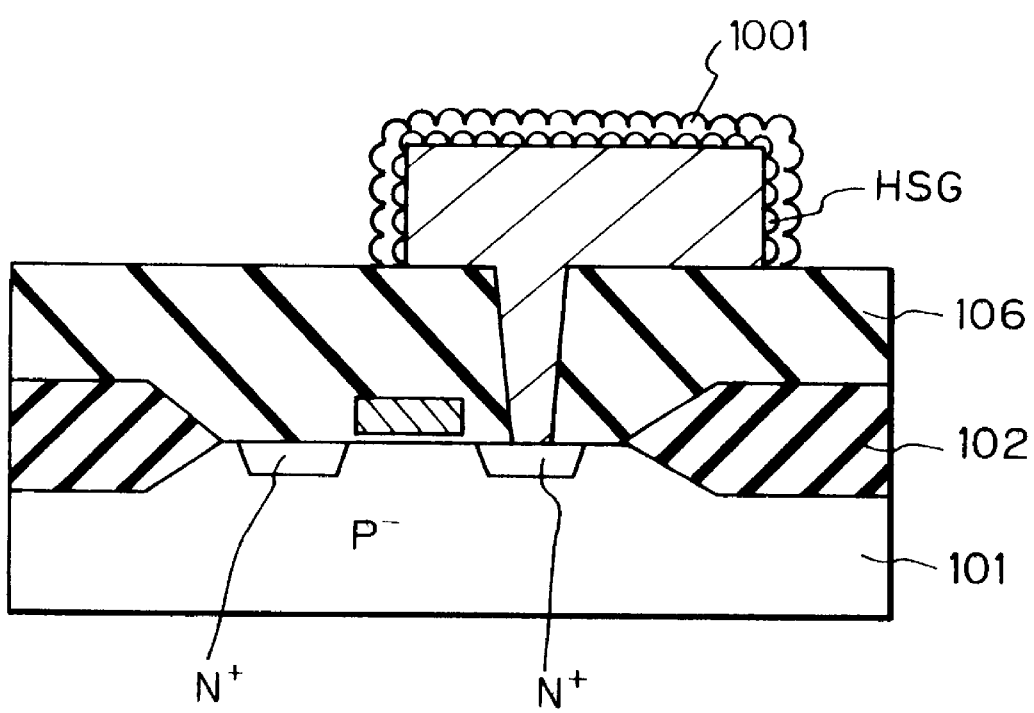
FIG. 10 is a cross-sectional view of a semiconductor device for explaining a modification of the first embodiment of the present invention.

In the first embodiment, although observation of light reflectance is carried out by directly irradiating the HSG polycrystalline silicon surface with light having a wavelength of about 240 nm to 500 nm, this observation can be carried out by irradiating a silicon nitride layer formed on the HSG polycrystalline silicon surface with this light. That is, as illustrated in FIG. 10, after the formation of HSG polycrystalline silicon, a natural oxide layer on the HSG polycrystalline silicon is etched by diluted fluorine acid. Then, the HSG polycrystalline silicon is exposed in an atmosphere of $NH_3$ gas and is ramp-heated for 1 minute. As a result, an about 10 nm thick silicon nitride layer 1001 is formed on the HSG polycrystalline silicon. In this case, since the silicon nitride layer 1001 is very thin, the light reflectance is hardly changed.

Note that the silicon nitride layer 1001 can serve as a part of the capacitor insulating layer 110, and therefore, it is unnecessary to remove the silicon nitride layer 1001 in the post stages.

If the silicon nitride layer 1101 is not formed, the wafer has to be promptly subjected to the unevenness detecting system of FIG. 4, since natural oxide is formed on the HSG polycrystalline silicon to reduce the light reflectance. However, if the silicon nitride layer 1001 is formed, the wafer can be allowed to stand for a long time such as a week, since no natural oxide is formed on the HSG polycrystalline silicon.

Figure 11:
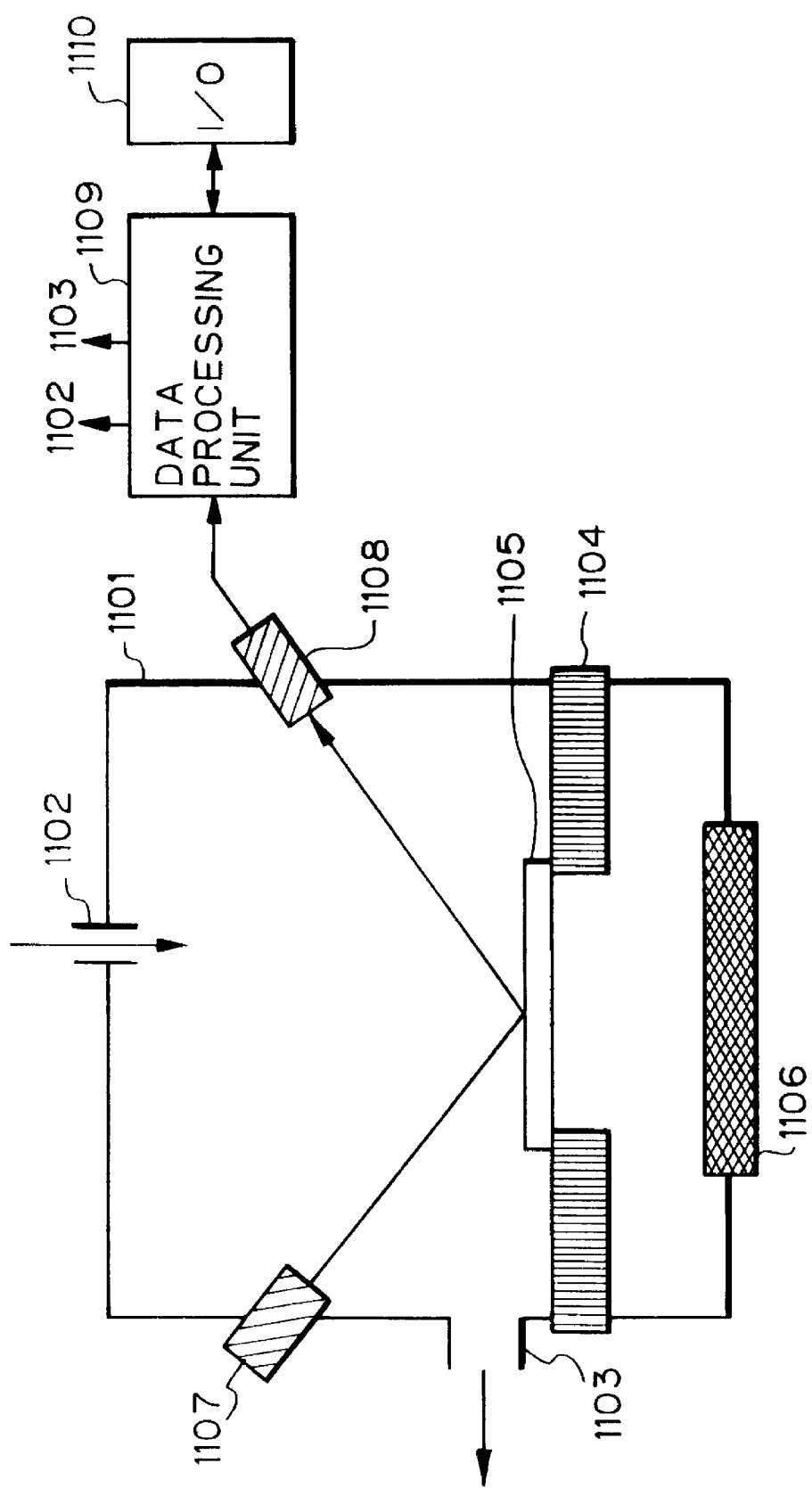
FIG. 11 is a diagram illustrating a second embodiment of the unevenness detecting system according to the present invention.

In FIG. 11, which illustrates a second embodiment of the unevenness detecting system according to the present invention, a leaf-type chamber 1101 has a gas inlet 1102 and a gas outlet 1103. The chamber 1101 is also provided with a stage 1104 for mounting a wafer 1105, and a heater 1106. In the chamber 1101, light having a wavelength of about 240 nm to 500 nm is irradiated so as to be incident to the wafer 1105, and reflected light from the wafer 1105 is detected by a detector 1108. The detector 1108 is connected to a data processing unit 1109 connected to an input/output unit 1110.

Also, the gas inlet 1102 and the gas outlet 1103 are controlled by the data processing unit 1109.

Figure 12:
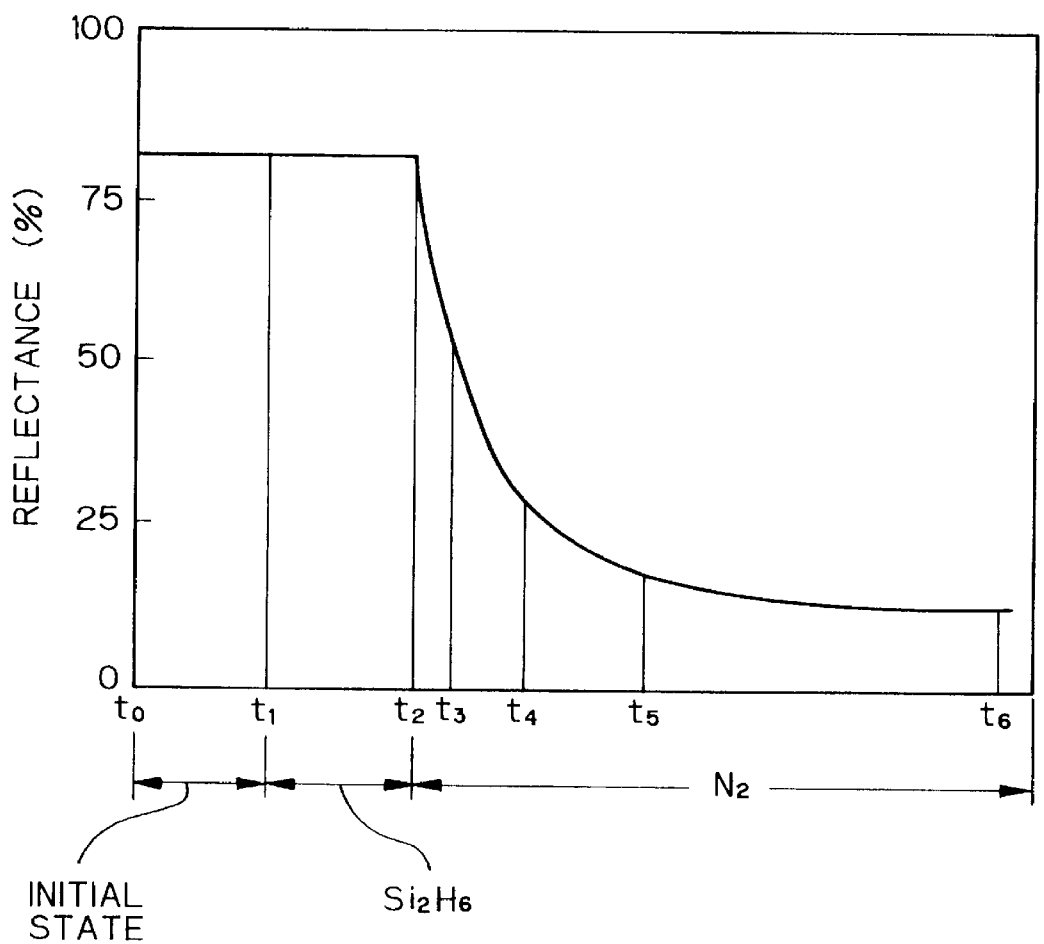
FIG. 12 is a timing diagram of the light reflectance characteristics of the wafer of FIG. 11.

The operation of the system of FIG. 11 is explained next with reference to FIG. 12.

First, from time $t_0$ to time $t_1$, the wafer 1105 having amorphous silicon thereon is put on the stage 1104. Then, the chamber 1101 is exhaused by an exhaust system (not shown), and is heated to about 580° C. by the heater 1106.

Next, from time $t_1$ to time $t_2$ ($t_2-t_1$=about 10 minutes), a gas of $Si_2H_6$ is supplied from the gas inlet 1102 to the chamber 1101 for about ten minutes while maintaining the pressure with the chamber 1101 at about 1 mTorr.

At time $t_2$, the $Si_2H_6$ is exhausted from the chamber 1101 via the gas outlet 1103, to begin an annealing operation using a gas of $N_2$.

Figure 13A:
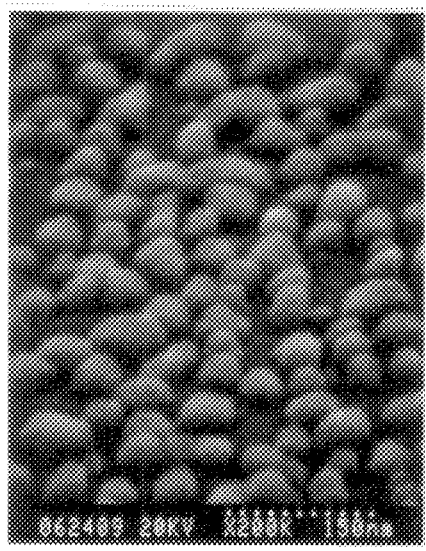
FIGS. 13A, 13B, 13C and 13D are photographs showing the states of HSG polycrystalline silicon grown on the wafer of FIG. 11.
Figure 13B:
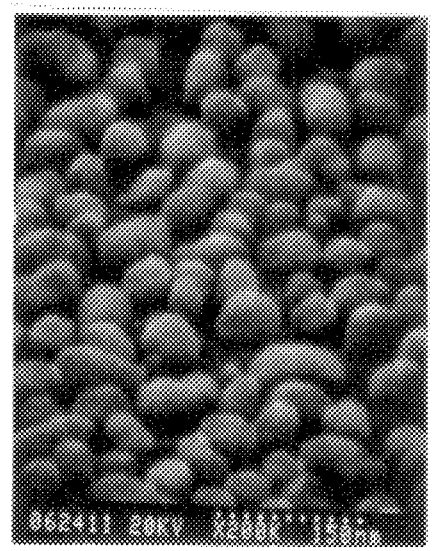
Figure 13C:
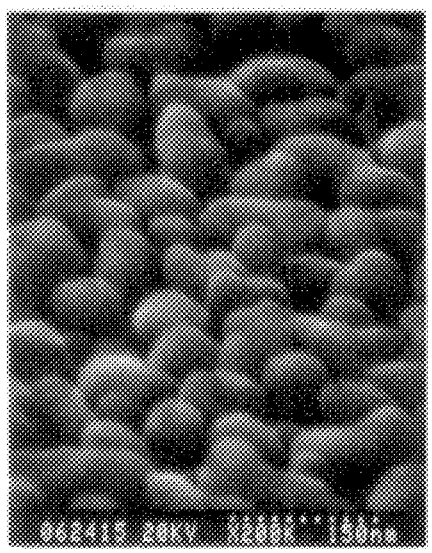
Figure 13D:
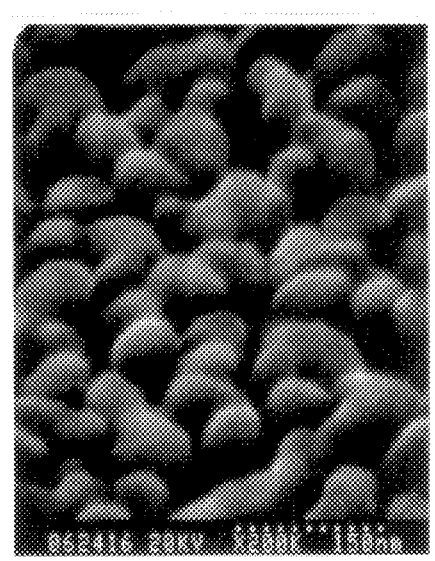
Figure 14:
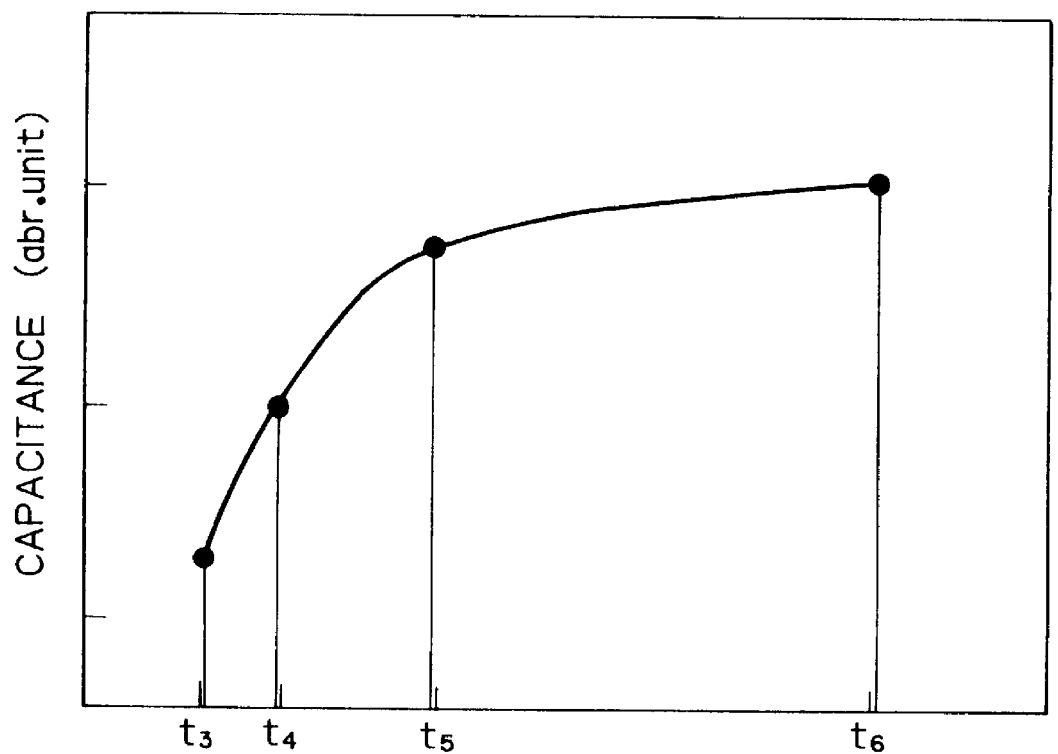
FIG. 14 is a diagram of the capacitance characteristics of the HSG polycrystalline silicon of FIGS. 13A, 13B, 13C and 13D.

In the second embodiment, the light reflectance of the wafer 1105 is continuously observed by the light source 1107, the detector 1108 and the data processing unit 1109, thus enhancing the throughput. For example, at time $t_3$, $t_4$ and $t_5$, the light reflectance is gradually decreased. In this case, the size of the HSG polycrystalline silicon are gradually increased as shown in FIGS. 13A, 13B and 13C. Also, at time $t_6$, the reflectance is unchanged, and the size of the HSG polycrystalline silicon is also unchanged as shown in FIG. 13D. Actually, the capacitance of capacitors formed by the wafers corresponding to the states at time $t_3$, $t_4$, $t_5$ and $t_6$, are changed as shown in FIG. 14.

Figure 15:
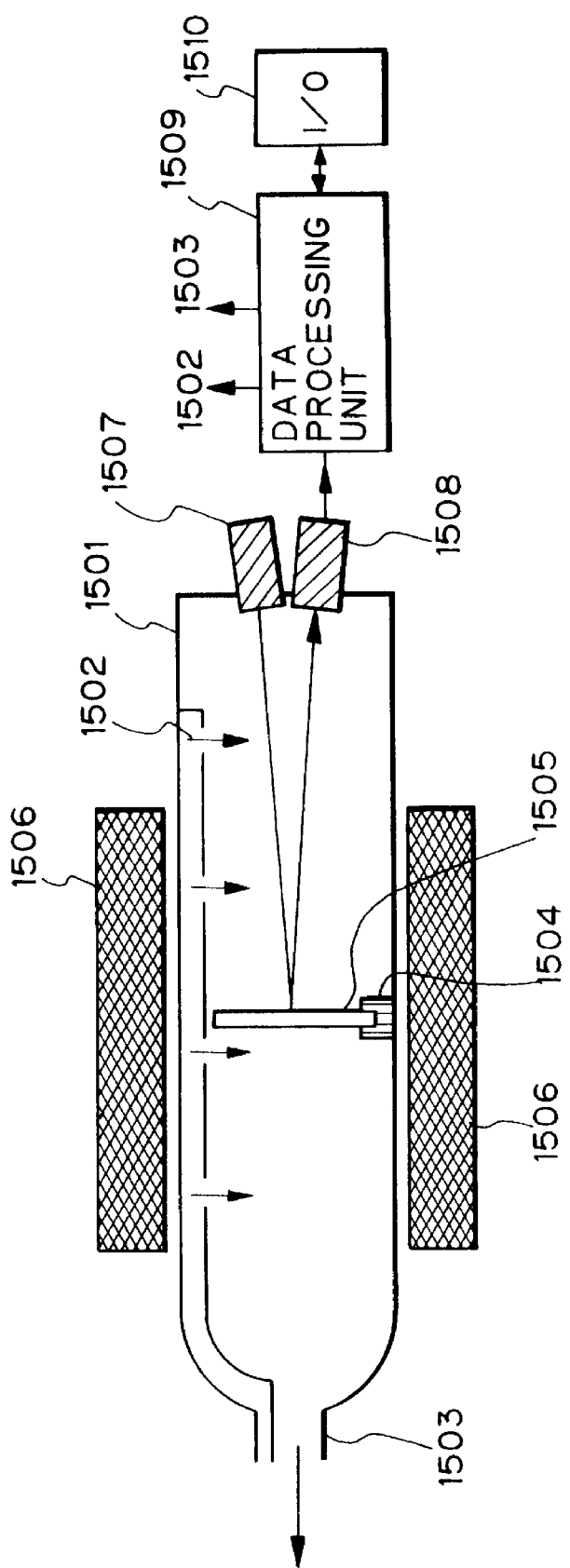
FIG. 15 is a diagram illustrating a third embodiment of the unevenness detecting system according to the present invention.

In FIG. 15, which illustrates a third embodiment of the unevenness detecting system according to the present invention, a batch-type chamber 1501 has a gas inlet 1502 and a gas outlet 1503. The chamber 1501 is also provided with a stage 1504 for mounting a wafer 1505, and a heater 1506. In the chamber 1501, light having a wavelength of about 240 nm to 500 nm is irradiated so as to be incident to the wafer 1505, and reflected light from the wafer 1505 is detected by a detector 1508. The detector 1508 is connected to a data processing unit 1509 connected to an input/output unit 1510.

The operation of the system of FIG. 15 is the same as that of the system of FIG. 11.

In the above-described embodiments, although light having a wavelength of about 240 μm to 500 μm is used, a line spectrum light such as 488 nm wavelength laser light can be used. Also, the present invention can be applied to measurement of unevenness degree of a surface other than an HSG polycrystalline silicon surface.

As explained hereinbefore, according to the present invention, a degree of unevenness of a surface of a semiconductor device can be easily and reliably detected without affecting the characteristics of the device.

We claim:

1. A method for manufacturing a semiconductor device, comprising the steps of:

forming an amorphous silicon layer;

performing a heating operation upon said amorphous silicon layer to grow a hemispherical-grain polycrystalline silicon layer on said amorphous silicon layer;

irradiating said hemispherical-grain polycrystalline silicon layer with light having a wavelength of approximately 240 nm to 500 nm; and measuring an intensity of reflected light from said hemispherical-grain polycrystalline silicon layer to determine the degree of an unevenness of said hemispherical-grain polycrystalline silicon layer.

2. A method for manufacturing a semiconductor device, comprising the steps of:

forming an amorphous silicon layer;

performing a heating operation upon said amorphous silicon layer to grow a hemispherical-grain polycrystalline silicon layer on said amorphous silicon layer;

irradiating said hemispherical-grain polycrystalline silicon layer with light having a wavelength of approximately 240 nm to 500 nm; and measuring an intensity of reflected light from said hemispherical-grain polycrystalline silicon layer to determine the degree of unevenness of said hemispherical-grain polycrystalline silicon layer; and determining the degree of an unevenness of said hemispherical-grain polycrystalline silicon layer in accordance with a stored relationship between the intensity of reflected light and the unevenness degree of said hemispherical-grain polycrystalline silicon layer.

3. A method for manufacturing a semiconductor device, comprising the steps of:

forming an amorphous silicon layer;

performing a heating operation upon said amorphous silicon layer to grow a hemispherical-grain polycrystalline silicon layer on said amorphous silicon layer;

irradiating said hemispherical-grain polycrystalline silicon layer with light having a wavelength of approximately 240 nm to 500 nm; and measuring an intensity of reflected light from said hemispherical-grain polycrystalline silicon layer to determine the degree of an unevenness of said hemispherical-grain polycrystalline silicon layer; and determining a capacitance of a capacitor having said hemispherical-grain polycrystalline silicon layer and said amorphous silicon layer as a capacitor electrode in accordance with a stored relationship between the intensity of reflected light and the capacitance of said capacitor.

4. A method for manufacturing a semiconductor device, comprising the steps of:

forming an amorphous silicon layer;

performing a heating operation upon said amorphous silicon layer to grow a hemispherical-grain polycrystalline silicon layer on said amorphous silicon layer;

forming an insulating layer on said hemispherical-grain polycrystalline silicon layer;

irradiating said insulating silicon layer with light having a wavelength of approximately 240 nm to 500 nm; and measuring an intensity of reflected light from said insulating layer to determine the degree of an unevenness of said hemispherical-grain polycrystalline silicon layer.

5. A method for manufacturing a semiconductor device, comprising the steps of:

forming an amorphous silicon layer;

performing a heating operation upon said amorphous silicon layer to grow a hemispherical-grain polycrystalline silicon layer on said amorphous silicon layer;

forming an insulating layer on said hemispherical-grain polycrystalline silicon layer;

irradiating said insulating layer with light having a wavelength of approximately 240 nm to 500 nm;

measuring the intensity of reflected light from said insulating layer and;

determining the degree of an unevenness of said hemispherical-grain polycrystalline silicon layer in accordance with a stored relationship between the intensity of reflected light and the unevenness degree of said hemispherical-grain polycrystalline silicon layer.

6. A method for manufacturing a semiconductor device, comprising the steps of:

forming an amorphous silicon layer;

performing a heating operation upon said amorphous silicon layer to grow a hemispherical-grain polycrystalline silicon layer on said amorphous silicon layer;

forming an insulating layer on said hemispherical-grain polycrystalline silicon layer;

irradiating said insulating layer with light having a wavelength of approximately 240 nm to 500 nm;

measuring an intensity of reflected light from said insulating layer; and determining a capacitance of a capacitor having said hemispherical-grain polycrystalline silicon layer and said amorphous silicon layer as a capacitor electrode in accordance with a stored relationship between the intensity of reflected light and the capacitance of said capacitor.

* * * * *